United States Patent

Kawakami et al.

[11] Patent Number: 5,191,709
[45] Date of Patent: * Mar. 9, 1993

[54] METHOD OF FORMING THROUGH-HOLES IN PRINTED WIRING BOARD

[75] Inventors: Shin Kawakami; Satoshi Haruyama; Hirotaka Okonogi, all of Saitama, Japan

[73] Assignee: Nippon CMK Corp., Japan

[*] Notice: The portion of the term of this patent subsequent to Jul. 28, 2009 has been disclaimed.

[21] Appl. No.: 739,706

[22] Filed: Aug. 2, 1991

[30] Foreign Application Priority Data

Aug. 10, 1990 [JP] Japan .................................. 2-213150

[51] Int. Cl.⁵ ............................................... H01K 3/10
[52] U.S. Cl. ..................................... 29/852; 174/263; 228/33; 427/97
[58] Field of Search ....................... 29/852; 427/96, 97; 228/33; 174/263

[56] References Cited

U.S. PATENT DOCUMENTS

| | | | |
|---|---|---|---|
| 4,478,882 | 10/1984 | Roberto | 427/97 |
| 4,622,239 | 11/1986 | Schoenthaler et al. | 427/96 |
| 4,646,057 | 2/1987 | Renolds | 29/852 X |
| 4,720,402 | 1/1968 | Wojcik | 427/96 X |
| 4,732,780 | 3/1988 | Mitoff et al. | 29/852 X |
| 4,808,435 | 2/1989 | Cropp et al. | 427/97 |

FOREIGN PATENT DOCUMENTS

| | | | |
|---|---|---|---|
| 1-236694 | 9/1989 | Japan | 427/97 |
| 571353 | 9/1977 | U.S.S.R. | 228/33 |

OTHER PUBLICATIONS

IBM Tech Disclosure Bulletin vol. 14, No. 9, Feb. 1972, pp. 2691-2692 by J. A. Lau et al.

Primary Examiner—Carl J. Arbes
Attorney, Agent, or Firm—Bruce L. Adams; Van C. Wilks

[57] ABSTRACT

In the method for forming through-holes of the present invention, by injecting a conductive material into the through-holes by means of a filling nozzle while removing the excessive conductive material with a squeegee, the filling can quickly and uniformly be performed independently of the board thickness of the substrate and the number and diameter of the through-holes.

4 Claims, 2 Drawing Sheets

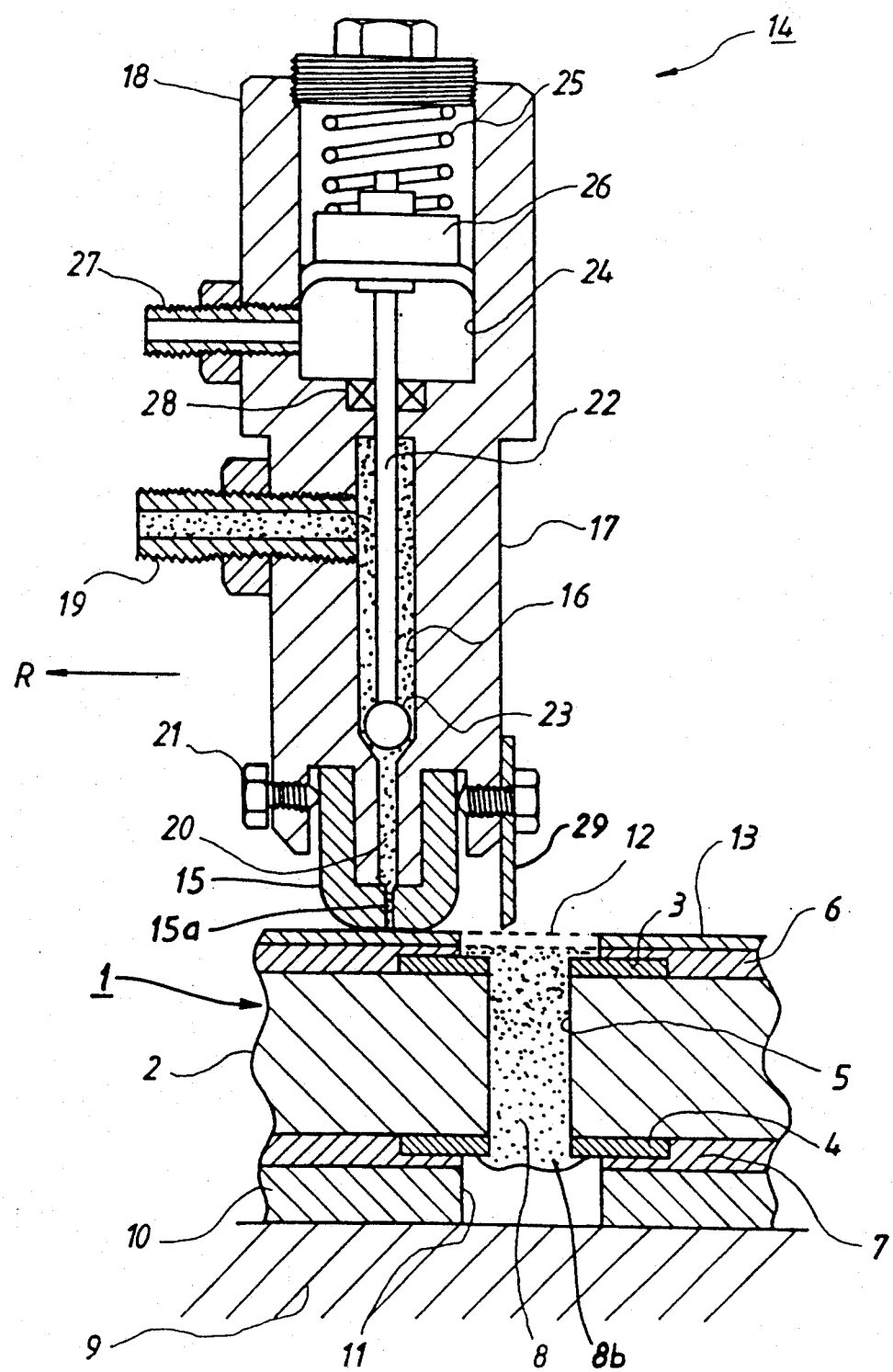
F I G. 1

METHOD OF FORMING THROUGH-HOLES IN PRINTED WIRING BOARD

BACKGROUND OF THE INVENTION

1. Field of the Invention

The present invention is related to a method for forming through-holes in a printed wiring board.

2. Prior Art

There are the following conventional methods for forming through-holes by filling a conductive material in the through-holes passing through the printed circuits in a printed wiring board. That is, a formation method in which a conductive material is deposited on filling pins and thereafter the pins are inserted into the through-holes made in the printed wiring board, thereby to deposit the conductive material deposited on the circumference of the filling pins inside the through-holes, and a method in which a silk plate for print corresponding to the circuit design of a printed wiring board is made and a conductive material is filled in the individual through-holes of the printed wiring board through the silk plate.

However, in the former method using pins of the conventional methods for forming through-holes, the amount of the conductive material deposited on the filling pins is absolutely small, and to fill the inside of the through-holes with the conductive material, a work of depositing the conductive material on the filling pins and a work of inserting the pins after deposition into the individual through-holes of the printed wiring board must be repeated a plurality number of times, so that this method has a disadvantage of low working efficiency in addition to the cumbersome work.

In addition, in the above work, the conductive material deposited inside the through-holes by the filling pins must be hardened each time, and thus the thermal damage to the material of the substrate of the printed wiring board is significant, so that there is a defect that the size stability of the printed wiring board is remarkably degraded.

Moreover, many pins are necessary at a time if the number of the through-holes of the printed wiring board is great, and usually it is impossible to use more than 1000 pins and the number of pins is restricted in terms of design, which results in a restriction on the size of the printed wiring board (usually the size larger than 300 m/m$^2$ is impossible).

Accordingly, the facilities and work processes such as the manufacture of a pin jig having pins arranged in correspondence to the individual through-holes of a printed wiring board are difficult both industrially and in the point of work, and there is a drawback of poor mass production capability.

Also, with the silk screen method which is the latter conventional formation method, there is unevenness in the squeegee pressure against the screen and it is difficult to completely fill the conductive material in the through-holes of the printed wiring board with the ordinary squeegee pressure, and for instance, the filling is impossible if the board thickness of the printed wiring board is thick or the diameter of the through-holes is small. (For instance, in the state of the art, the limit of the diameter of the through-holes is 0.7 mm if the board thickness is 1.6 mm.)

And, with such method, the fluidity of the conductive material has a large effect on the evenness of the filling, and the complexity of the work further increases. Accordingly, usually a solvent is added into the conductive material to uniformize the fluidity of the conductive material, but on the other hand, the solvent is vaporized in the through-holes by heating when the conductive material is hardened after the filling, thereby to cause a collection of air bubbles and cracks, which result in conduction failure or the like, and thus there is a large problem in removal of the solvent.

That is, a solvent of the higher alcohol system which has a high boiling point and is difficult to vaporize is used as the solvent to maintain the fluidity of the conductive material, and a temperature at which no air bubble occurs and time are required to completely vaporize the solvent for complete removable thereof, which affects the reliability of the printed wiring board.

SUMMARY OF THE INVENTION

Accordingly, the present invention was developed in view of the drawbacks in the conventional method for forming through-holes, and its object is to provide a method for forming through-holes wherein a conductive material can uniformly be filled independently of the board thickness of the printed wiring board, and the number and diameter of the through-holes.

In order to accomplish the above object, the present invention is a method for forming through-holes in a printed wiring board having printed circuits formed on both sides of a substrate, and through-holes conducting the printed circuits on both sides, characterized by the steps of:

mounting and setting the substrate on the upper side of a cover plate while aligning the individual through-holes with the relief holes of the cover plate and mounting and setting a mask on the upper side of the substrate while aligning the through-holes of the mask with the individual through-holes, and then injecting and filling a conductive material into the individual through-holes of the substrate from a filling nozzle through the individual through-holes of the mask and removing the excessive part of the conductive material filled in the individual through-holes of the substrate by the use of a squeegee.

In the method for forming through-holes of the present invention, by injecting a conductive material into the through-holes by means of a filling nozzle while removing the excessive conductive material with a squeegee, the filling can quickly and uniformly be performed independently of the board thickness of the substrate and the number and diameter of the through-holes.

BRIEF DESCRIPTION OF THE DRAWING

FIGS. 1 and 2 are explanatory views showing the first and second embodiments of the method for forming through-holes of the present invention.

DETAILED DESCRIPTION OF THE PREFERRED EMBODIMENTS

Figure 2:
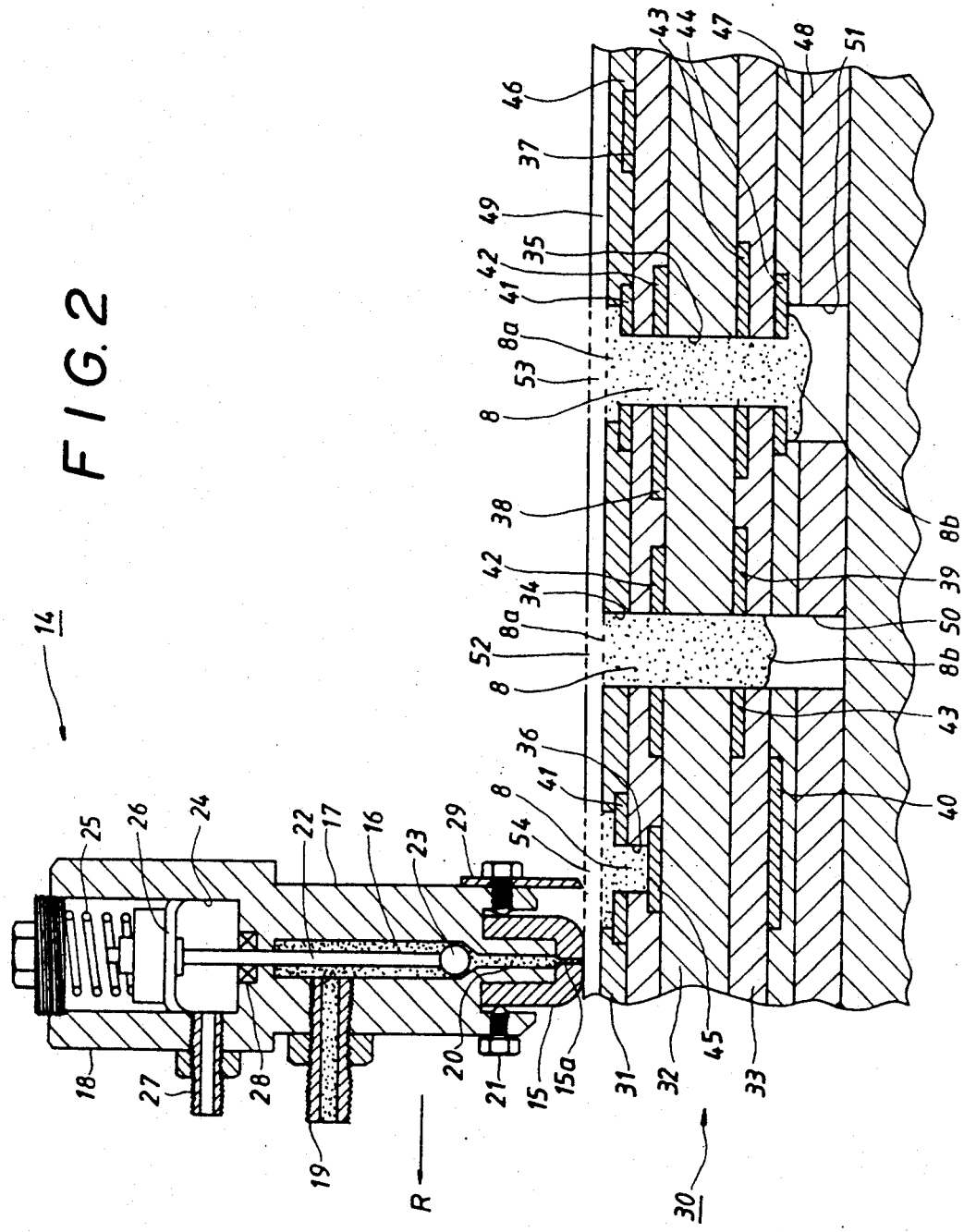

Now, the embodiments of the present invention are described in conjunction with the drawing.

First Embodiment

FIG. 1 is an explanatory view showing the first embodiment of the method for forming through-holes of the present invention.

In the figure, 1 is a printed wiring board, which is constructed by forming required printed circuits (not shown) of conductor circuits on both the front and rear sides of a substrate 2 of an insulating material, disposing connecting lands 3 and 4 for electrically connecting the printed circuits of both the front and rear sides on the printed circuits on both sides of the substrate 2, and boring a through-hole 5 between both connecting lands 3 and 4 by a punching (press) work or drill work.

In addition, under resists (solder resists) 6 and 7 are deposited on the printed circuits on the front and rear sides of the substrate 2.

And, when a conductive material 8 is filled in the through-hole 5 of the printed wiring board 1 of the above described construction, the printed wiring board 1 is mounted and set on a cover plate 10 placed on the upper side of a stand 9.

At this time, the setting is made by aligning the relief hole 11 of the cover plate 10 with the through-hole 5 of the printed wiring board 1, as shown in FIG. 1.

Further, a mask 13 provided with a filling through-hole 12 is mounted and set on the upper side of the printed wiring board 1 while aligning the filling through-hole 12 with the through-hole 5 of the printed wiring board 1.

Thereafter, the conductive material 8 is discharged from the nozzle end 15 of a filling nozzle 14 mounted above the mask 13 so as to freely move in the horizontal direction, and the conductive material 8 is filled into the through-hole 5 of the printed wiring board 1 via the filling through-hole 12 of the mask 13.

The filling nozzle 14 comprises a nozzle main body 17 provided with a filling section of the conductive material 8, and an operation section 18 for a discharge valve provided above the filling section 16 of the nozzle main body 17.

And, the conductive material 8 is supplied from a supply section 16 (not shown) to the filling section 16 through a supply port 19, and the nozzle end 15 is attached to the discharge port 20 of the filling section 16 by a mounting screw 21.

Moreover, a discharge valve 23 is mounted on the discharge port 20 of the filling section 16 via an operation lever 22, and the upper end of the operation lever 22 is connected to an operation valve 26 which is elastically mounted by a spring 25 in an operation chamber 24 provided above the nozzle main body 17.

In addition, an air pressure source (not shown) is connected to the operation chamber 24 of the operation section 18 through a connecting port 27 and a control section (not shown). Incidentally, 28 represents the slide bearing of the operation lever 22.

Furthermore, in the construction of the filling nozzle 14, a squeegee 29 is attached to a side of the nozzle end 15. The squeegee 29 is mounted in a position which is at the rear with respect to the advance direction of the horizontal moving direction of the filling nozzle 14.

In addition, the nozzle end 15 can be replaced using the mounting screw 21 so as to select the size of its discharge port 15a, but it is preferably formed of a plastic material or synthetic rubber in consideration of the rear resistance of the surface abutting the mask 13 and the protection of the mask 13, and similarly it is desirable to account for the material of the squeegee 29.

Accordingly, when the conductive material 8 is filled in the through-hole 5 via the mask 13 by means of the filling nozzle 14, the nozzle end 15 is made to abut on the upper surface of the mask 13 and the filling nozzle 14 is moved in the horizontal direction through a control section (not shown).

And, the through-hole 5 of the printed wiring board 1 is scanned during the horizontal movement, and at a position corresponding thereto, the operation lever 22 of the operation section 18 is caused to rise against the elastic force of the spring 25 to put the discharge valve 23 in an open state thereby opening the discharge port 20, and the conductive material 8 fed by pressure from the connecting port 19 into the filling section 16 through the supply source is discharged from the nozzle end 15, and injected and filled into the through-hole 5 via the filling through-hole 12 of the mask 13.

The conductive material 8 injected into the through-hole 5 is exposed (8b) on the rear side of the substrate 2, but it is exposed in the relief hole 11 of the cover plate 10, and thus the connected state of the exposed part 8b and the connecting land 4 on the rear side can completely be secured to prevent any electrical connection failure from occurring.

In addition, the relief hole 11 of the cover plate 10 preferably has an inner diameter which is rather larger than the diameter of the through-hole 5.

In addition to the formation by a silk plate (e.g. #180-300), the mask 13 may also be implemented by another mask in which consideration is given so that the conductive material 8 discharged from the filling nozzle 14 does not flow out over the position corresponding to the through-hole 5.

Further, although, in FIG. 1, one through-hole 5 made in the printed wiring board 1 has been described, the filling can also continuously be made in regards to a plurality of through-hole 5 by a method similar to the foregoing.

An example of the filling condition using the filling nozzle 14 is given below.

| Scanning of the filling nozzle | |
| --- | --- |
| Speed | 10 mm/sec |
| Board thickness of printed wiring board | 1.6 mm |
| Through-hole diameter | 0.4 mm |
| Injection pressure | 6.0 kg/cm$^2$ |
| Viscosity of conductive material | 1000 cps/25° C. |

Incidentally, a solventless copper paste was used as the conductive material.

Accordingly, as the filling nozzle 14 is horizontally moved after the conductive material 8 is filled in the through-hole 5 by the filling nozzle 14, the conductive material 8 exposed on the upper side of the through-hole 5 can be removed along the filling through-hole 12 of the mask 13 by the squeegee 29 attached to the nozzle end 15.

After the filling under the above condition, by hardening the conductive material 8 in the through-hole 5 by drying it at 150° C. in an oven heater, a conductive circuit was formed in the through-hole 5.

Second Embodiment

FIG. 2 is an explanatory view showing the second embodiment of the present invention.

This is an embodiment for the method for filling the conductive material 8 in the through-holes 34 and 35 and connection hole 36 in a multilayered printed wiring board 30 comprising three stacked substrates 31, 32 and 33, instead of the first embodiment as to the through-hole 5 of the printed wiring board 1 having printed circuits on both sides thereof.

Printed circuits 37, 38, 39 and 40 are disposed on both the front and rear sides of the respective substrates 31, 32 and 33 of the printed wiring board 30, connecting lands 41, 42, 43 and 44 for connecting the individual printed circuits of the respective substrates 31, 32 and 33 to each other are disposed on the printed circuits of the respective substrates 31, 32 and 33, the respective through-holes 34 and 35 are to electrically connect the connecting lands 42 and 43, and the connecting lands 41, 42, 43 and 44, and the connecting hole 36 are to electrically connect the connecting land 41 of the printed circuit 37 on the surface side of the printed circuits of the substrate 31 to the connecting circuit 45 in the rear printed circuit 38.

In addition, on the uppermost substrate 31 and the lowermost substrate 33 of the printed wiring board 30, solder resists 46 and 47 are deposited which cover their respective printed circuits 37 and 40.

Further, the individual through-holes 34 and 35 are machined by a punching work or drill work, and the connecting hole 36 is made by a drill.

And, to fill the conductive material 8 in the respective through-holes 34 and 35 and the connecting hole 36 of the printed wiring board 30, a cover plate 48 is mounted on the upper surface of a stand 9 similarly to the first embodiment and the printed wiring board 30 is mounted and set on the upper side of the cover plate 48, and after mounting and setting a mask 49 on the upper side of the printed wiring board 30, a filling nozzle 14 is horizontally moved from the through-hole 35 side to the connecting hole 36 similarly to the first embodiment, thereby filling the conductive material 8 in the respective through-holes 34 and 35 and the connecting hole 36.

In addition, relief holes 50 and 51 and filling through-holes 52, 53 and 54 are respectively disposed in the cover plate 48 and mask 49 at the positions corresponding to the positions at which the respective through-holes 34 and 35 and the connecting hole 36 of the printed wiring board 30 are disposed, and the cover plate 48 and mask 49 are set while aligning their respective relief holes 50 and 51 and filling through-holes 52 and 53 with the through-holes 34 and 35 and the connecting hole 36 of the printed wiring board 30.

Moreover, since a squeegee 29 is mounted on the filling nozzle 14 similarly to the first embodiment, the filling can be performed while the excessive conductive material 8 of the filled conductive material 8 in the respective through-holes and the connecting hole 36 which is exposed on the upper side is removed along the respective filling through-holes 52, 53 and 54 of the mask 49.

In accordance with the first and second embodiments, the conductive material 8 is injected by the filling nozzle 14 into the through-holes 5, 34 and 35 or the connecting hole 36 through the filling through-holes 12, 52, 53 and 54 of the mask 13 or 49 while providing the nozzle compressed air, and thus the filling into small holes is made possible by adjusting and controlling the injection condition independently of the fluidity of the filling material or the board thickness of the substrate, whereby a high circuit density can be achieved.

Moreover, since the filling can be performed independently of the fluidity of the filling material, it is not required to take means for adding a solvent to obtain an appropriate fluidity of the conductive material, and thus the hindrance caused by the addition of the solvent can be avoided. In other words, the solventless filling can be accomplished by the injection using a filling nozzle.

And, the nozzle end 15 in the filling nozzle 14 is replaceable, and a pressurized filling according to the discharge condition of the filling material or the diameter of the through-holes and the board thickness can be uniformly and stably accomplished.

Also, the filling is performed through a mask so that the deposition of the filling material on unnecessary portions can be prevented.

In addition, the work efficiency of the filling work can be increased because a continuous filling can be performed to the portions to be filled which are corresponding to the circuit design of a printed wiring board.

As apparent from the above description, in accordance with the method for forming through-holes of the present invention, the filling of a conductive material into through-holes can be accomplished with even and stable workability, which is not dependent on the board thickness of a printed wiring board or the size of the diameter of the through-holes or the fluidity of the filling material which is a conductive material or the like.

What is claimed is:

1. A method for filling through-holes in a printed wiring board having printed circuits formed on both sides of a substrate, and through-holes in the substrate for interconnecting the printed circuits on both sides thereof, the method comprising the steps of:
    mounting and setting said substrate on the upper side of a cover plate while aligning said individual through-holes of the substrate with relief holes of the cover plate and mounting and setting a mask on the upper side of said substrate while aligning the through-holes of the mask with said individual through-holes of the substrate, and
    then injecting and filling a conductive material into the individual through-holes of said substrate from a filling nozzle through the individual through-holes of said mask and removing the excessive part of the conductive material filled in the individual through-holes of said substrate by the use of a squeegee.

2. A method for filling through-holes in a printed wiring board as set forth in claim 1 wherein as said mask, a silk plate is used which is provided with filling through-holes in the position corresponding to the filling position such as the through-holes in said printed wiring board.

3. A method for filling through-holes in a printed wiring board as set forth in claim 1 wherein as said nozzle, a nozzle is used which comprises a filling section of a filling material and a nozzle end provided at the tip of the filling section, and an operation section of a valve for discharging the filling material to said nozzle end and a supply section of the filling material which are connected to said filling section.

4. A method for filling through-holes in a printed wiring board as set forth in claim 1 wherein a solventless filling material is used as said conductive material.

* * * * *